United States Patent
Kurauchi et al.

(10) Patent No.: US 7,242,582 B2
(45) Date of Patent: Jul. 10, 2007

(54) SEMICONDUCTOR MODULE MOUNTING STRUCTURE, A CARDLIKE SEMICONDUCTOR MODULE, AND HEAT RECEIVING MEMBERS BONDED TO THE CARDLIKE SEMICONDUCTOR MODULE

(75) Inventors: Tsuyoshi Kurauchi, Anjo (JP); Tomoaki Nakano, Oobu (JP); Hiroaki Arai, Kariya (JP)

(73) Assignee: Denso Corporation, Kariya (JP)

( * ) Notice: Subject to any disclaimer, the term of this patent is extended or adjusted under 35 U.S.C. 154(b) by 286 days.

(21) Appl. No.: 11/105,449

(22) Filed: Apr. 14, 2005

(65) Prior Publication Data

US 2005/0230816 A1   Oct. 20, 2005

(30) Foreign Application Priority Data

Apr. 20, 2004   (JP)   ............... 2004-124663

(51) Int. Cl.
*H05K 7/20* (2006.01)
*H01L 23/34* (2006.01)

(52) U.S. Cl. .............. 361/704; 361/707; 257/706; 257/707; 257/712; 257/787; 257/788

(58) Field of Classification Search ............ None
See application file for complete search history.

(56) References Cited

U.S. PATENT DOCUMENTS

| | | | | |
|---|---|---|---|---|
| 4,470,063 A | * | 9/1984 | Arakawa et al. | ............ 257/746 |
| 5,216,283 A | * | 6/1993 | Lin | ............ 257/787 |
| 5,311,060 A | * | 5/1994 | Rostoker et al. | ............ 257/796 |
| 5,367,196 A | * | 11/1994 | Mahulikar et al. | ............ 257/787 |
| 5,396,403 A | * | 3/1995 | Patel | ............ 361/705 |
| 6,542,365 B2 | | 4/2003 | Inoue | |
| 6,693,350 B2 | | 2/2004 | Teshima et al. | |
| 6,703,707 B1 | | 3/2004 | Mamitsu et al. | |
| 6,798,062 B2 | | 9/2004 | Miamitsu et al. | |
| 6,845,012 B2 | | 1/2005 | Ohkouchi | |
| 6,891,265 B2 | * | 5/2005 | Mamitsu et al. | ............ 257/718 |
| 6,933,619 B2 | * | 8/2005 | Caletka et al. | ............ 257/796 |
| 2004/0070072 A1 | | 4/2004 | Mamitsu et al. | |
| 2004/0089925 A1 | | 5/2004 | Fukuda et al. | |
| 2004/0089940 A1 | | 5/2004 | Mamitsu et al. | |
| 2004/0089941 A1 | | 5/2004 | Mamitsu et al. | |
| 2004/0089942 A1 | | 5/2004 | Mamitsu et al. | |
| 2004/0097082 A1 | | 5/2004 | Mamitsu et al. | |
| 2004/0144996 A1 | | 7/2004 | Inoue | |
| 2004/0183188 A1 | | 9/2004 | Oohama | |

FOREIGN PATENT DOCUMENTS

JP          03180054 A  *  8/1991

(Continued)

*Primary Examiner*—Boris Chervinsky
(74) *Attorney, Agent, or Firm*—Oliff & Berridge PLC (57) ABSTRACT

A semiconductor module has metallic radiator plates provided at central regions of principal surfaces of a sealing resin so as to expose from these principal surfaces. The metallic radiator plates and the principal surfaces of the sealing resin are bonded via grease gaps to heat receiving members. The grease gaps are widened in outer regions far from the metallic radiator plates compared with inner regions adjacent to the metallic radiator plates, to prevent external air from entering into the grease gaps even when the semiconductor module causes repetitive thermal expansions and contractions.

25 Claims, 5 Drawing Sheets

FOREIGN PATENT DOCUMENTS

| | | |
|---|---|---|
| JP | A 2000-243881 | 9/2000 |
| JP | A 2001-156219 | 6/2001 |
| JP | A 2001-156225 | 6/2001 |
| JP | A 2001-32005 | 11/2001 |
| JP | A 2001-308263 | 11/2001 |
| JP | A 2001-320005 | 11/2001 |
| JP | A 2002-26215 | 1/2002 |
| JP | B2 342298 | 4/2003 |
| JP | B2 3422298 | 4/2003 |
| JP | A 2004-208411 | 7/2004 |
| JP | A 2004-311905 | 11/2004 |

* cited by examiner

SEMICONDUCTOR MODULE MOUNTING STRUCTURE, A CARDLIKE SEMICONDUCTOR MODULE, AND HEAT RECEIVING MEMBERS BONDED TO THE CARDLIKE SEMICONDUCTOR MODULE

CROSS-REFERENCE TO RELATED APPLICATION

This application is based upon and claims the benefit of priority from earlier Japanese Patent Application No. 2004-124663 filed on Apr. 20, 2004 so that the description of which is incorporated herein by reference.

BACKGROUND OF THE INVENTION

The present invention relates to a semiconductor module mounting structure, a cardlike semiconductor module, and heat receiving members bonded to the cardlike semiconductor module. The present invention is preferably applicable to a semiconductor module mounting structure for bonding a cardlike semiconductor module (i.e. a so-called double-sided semiconductor module having electrodes on both surfaces thereof) to the members to be bonded with thermal conductive grease.

To improve heat radiation properties of a power semiconductor module incorporating a semiconductor switching element chip used for electric power control, the Japanese patent application Laid-open No. 2000-243881 discloses a cardlike semiconductor module including two metallic radiator plates independently exposed on principal surfaces of the power semiconductor module. According to this conventional cardlike semiconductor module, two metallic radiator plates can serve as electrodes being independently connected to two principal electrodes of the above-described semiconductor switching element chip. In this respect, this kind of cardlike semiconductor module is referred to as a double-sided electrode type semiconductor module.

The double-sided electrode type semiconductor module is sandwiched between a pair of heat receiving members directly or via thin insulating sheets (resin films), so that a pair of metallic radiator plates of the power semiconductor module can be independently brought into contact with a pair of heat receiving members. With this arrangement, heat of the semiconductor switching element chip can be radiated or released to the heat receiving members via the metallic radiator plates (and the insulating sheets, if used).

According to this semiconductor module mounting structure, it is very important to reduce a contact thermal resistance between the metallic radiator plates of the power semiconductor module and the heat receiving members contacting with these metallic radiator plates. To this end, it is conventionally known to fill the gaps between the metallic radiator plates and the heat receiving members with appropriate thermal conductive grease having excellent thermal conductivity. For example, the Japanese patent application Laid-open No. 13-308263 (2001) discloses an inverter device having a semiconductor module bonding structure with applied grease.

According to the above-described conventional semiconductor module mounting structure, the semiconductor switching element chip is repetitively heated and cooled. The semiconductor module, especially the metallic radiator plates having large thermal expansion coefficients, will repeat expansion-and-contraction cycles, namely repetitively expand and contract in the surface direction as well as in the thickness direction.

When the semiconductor module causes repetitive expansions and contractions in the surface direction, no serious problems will arise. However, the repetitive expansions and contractions in the thickness direction will cause problems. More specifically, the repetitive expansions and contractions of the semiconductor module will forcibly and greatly change the size of small gaps defining grease layers (hereinafter, referred to as grease gaps) formed between the heat receiving members and the metallic radiator plates.

It is usual to set a pair of heat receiving members sandwiching the power semiconductor module so as to maintain a substantially constant distance therebetween. However, strictly speaking, the heat receiving members themselves cause thermal expansions and contractions. The distance between the heat receiving members decreases in high-temperature conditions. On the other hand, the distance increases in low-temperature conditions. As a result, in a condition that the metallic radiator plates of the semiconductor module and the heat receiving members have high temperatures, the grease gaps shrink and accordingly the grease is forced to shift along the heat dissipating surfaces of the metallic radiator plates and pushed out of the grease gaps between the heat receiving members and the metallic radiator plates. On the other hand, in a condition that the metallic radiator plates of the semiconductor module and the heat receiving members have low temperatures, the grease gaps expand and accordingly the grease is sucked into the grease gaps between the heat receiving members and the metallic radiator plates.

Such repetitive shifting of the grease in the surface direction will induce adverse invasion of external air into respective grease gaps and will leave undesirable air layers between the heat receiving members and the metallic radiator plates. The air layers will greatly increase the thermal resistance in the process of radiating or releasing the heat from the metallic radiator plates to the heat receiving members.

To solve this problem, it is desirable to arrange at least one of two heat receiving members so as to freely shift in the thickness direction in accordance with expansions and contractions of the cardlike semiconductor module occurring in the thickness direction. However, according to ordinary cardlike semiconductor module stack structures, flexibly changing the distance between the paired heat receiving members in accordance with expansions and contractions of the cardlike semiconductor module is very difficult because these heat receiving members are fixed in a casing or housing in many cases.

Alternatively, it may be possible to use bolts or other fasteners to tightly hold the cardlike semiconductor module between a pair of heat receiving members disposed in the thickness direction. This may bring the effects of reducing the elastic compressions of the cardlike semiconductor module and the heat receiving members so as to increase the thicknesses even when the cardlike semiconductor module and the heat receiving members shrink in their cooled conditions, and as a result suppressing changes of grease gaps. However, in view of strength of the cardlike semiconductor module, it is difficult to give the power semiconductor module a sufficient capability of elastically compressing.

SUMMARY OF THE INVENTION

In view of the above-described problems, the inventors of this patent application provide useful inventions relating to a semiconductor module mounting structure which includes a semiconductor module having metallic radiator plates provided on two principal surfaces thereof and a pair of heat receiving members sandwiching this semiconductor module directly or via insulating sheets.

More specifically, the present invention has an object to provide a semiconductor module mounting structure capable of adequately preventing external air from entering into grease gaps between the metallic radiator plates and the heat receiving members regardless of repetitive expansions and contractions of the semiconductor module.

In order to accomplish the above and other related objects, the present invention provides a semiconductor module mounting structure including a cardlike semiconductor module, heat receiving members, metallic radiator gaps, and sealing resin gaps. The cardlike semiconductor module includes a semiconductor chip, a sealing resin accommodating the semiconductor chip and having two principal surfaces substantially parallel to each other, and metallic radiator plates having flat heat dissipating surfaces exposed from the principal surfaces of the sealing resin and fixed on central regions of the principal surfaces of the sealing resin. The heat receiving members have heat receiving surfaces bonded to the heat dissipating surfaces of the metallic radiator plates directly or via insulating sheets having electrical insulating properties, to absorb heat from the heat dissipating surfaces of the metallic radiator plates. The metallic radiator gaps are filled with thermal conductive grease and are positioned between the heat dissipating surfaces of the metallic radiator plates and the heat receiving members or the insulating sheets. The sealing resin gaps are filled with thermal conductive grease and are positioned between the principal surfaces of the sealing resin and the heat receiving members or the insulating sheets at regions surrounding the metallic radiator plates. And, the sealing resin gaps have grease reservoirs as enlarged portions larger than the metallic radiator gaps.

Furthermore, the present invention has an object to provide a cardlike semiconductor module preferably applicable to this semiconductor module mounting structure.

In order to accomplish the above and other related objects, the present invention provides a cardlike semiconductor module including a semiconductor chip, a sealing resin accommodating the semiconductor chip and having two principal surfaces substantially parallel to each other, and metallic radiator plates having flat heat dissipating surfaces exposed from the principal surfaces of the sealing resin and fixed on central regions of the principal surfaces of the sealing resin. The principal surfaces of the sealing resin define grease reservoirs surrounding the metallic radiator plates. And, the grease reservoirs are arranged by reducing the thickness of the sealing resin at principal surfaces corresponding to the grease reservoirs compared with the thickness of the sealing resin at principal surfaces corresponding to the metallic radiator plates.

Moreover, the present invention has an object to provide heat receiving members bonded to this cardlike semiconductor module.

In order to accomplish the above and other related objects, the present invention provides a pair of heat receiving members bonded to the above-described cardlike semiconductor module. The heat receiving members of this invention have heat receiving surfaces facing to the principal surfaces of the sealing resin and to the heat dissipating surfaces of the metallic radiator plates, and thicknesses of the heat receiving members are reduced at regions surrounding the metallic radiator plates compared with regions adjacent to the metallic radiator plates so as to form grease reservoirs at the regions surrounding the metallic radiator plates.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

As best and preferable modes for embodying the present invention, the inventors of this patent application provide a semiconductor module mounting structure, a cardlike semiconductor module preferably used for this semiconductor module mounting structure, and heat receiving members bonded to the cardlike semiconductor module.

More specifically, the inventors provide a semiconductor module mounting structure including a cardlike semiconductor module, heat receiving members, metallic radiator gaps, and sealing resin gaps. The cardlike semiconductor module includes a semiconductor chip, a sealing resin accommodating the semiconductor chip and having two principal surfaces substantially parallel to each other, and metallic radiator plates having flat heat dissipating surfaces exposed from the principal surfaces of the sealing resin and fixed on central regions of the principal surfaces of the sealing resin. The heat receiving members have heat receiving surfaces bonded to the heat dissipating surfaces of the metallic radiator plates directly or via insulating sheets having electrical insulating properties, to absorb heat from the heat dissipating surfaces of the metallic radiator plates. The metallic radiator gaps are filled with thermal conductive grease and are positioned between the heat dissipating surfaces of the metallic radiator plates and the heat receiving members or the insulating sheets. The sealing resin gaps are filled with the thermal conductive grease and are positioned between the principal surfaces of the sealing resin and the heat receiving members or the insulating sheets at regions surrounding the metallic radiator plates. And, the sealing resin gaps have grease reservoirs as enlarged portions larger than the metallic radiator gaps.

This invention relates to a semiconductor module mounting structure which include a semiconductor module having metallic radiator plates provided on its principal surfaces, i.e. a cardlike semiconductor module (hereinafter, referred to as a double-sided electrode type semiconductor module), and a pair of heat receiving members sandwiching this semiconductor module directly or via insulating sheets. More specifically, this invention is characterized in that the grease reservoirs are provided in the sealing resin gaps formed between the principal surfaces of the sealing resin of the semiconductor module (i.e. the surfaces facing to the heat receiving members) and the heat receiving members. And, the sizes of the grease reservoirs are greater by predetermined distances than those of the metallic radiator gaps formed between the metallic radiator plates of the semiconductor module and the heat receiving members.

The sizes of the grease reservoirs are determined so as to assure the sealing resin gaps sufficiently greater than the metallic radiator gaps even in an allowable maximum temperature condition. This arrangement brings the effect of suppressing changes of the sealing resin gaps. According to this arrangement, the grease gaps are enlarged in the vicinity of the periphery of the metallic radiator gaps. Therefore, even in a situation that the metallic radiator gaps are subjected to the expansion-and-contraction cycles as described above, i.e. even when the grease filled in the metallic radiator gaps flow in the surface direction (i.e. in the direction parallel to the principal surfaces), the change rates of respective sealing resin gaps can be substantially reduced. The sealing resin gaps can store a great amount of grease compared with the metallic radiator gaps. Therefore, the grease stored in the sealing resin gaps flow at lower rates compared with the flow rates of the grease flowing in the above-described metallic radiator gaps. This arrangement prevents the outer surface of the grease filled in the sealing resin gaps from shifting in the surface direction of the semiconductor module (i.e. the direction normal to the thickness direction of the semiconductor module). This arrangement brings the effect of adequately preventing invasion of external air into the above-described sealing resin gaps or into the metallic radiator gaps.

Preferably, the lengths of respective sealing resin gaps in the thickness direction of the semiconductor module (i.e. the widths of the sealing resin gaps) are equal to or greater than 5 times (more preferably, 10 times) the metallic radiator gaps. This setting brings the effect of suppressing changes of respective sealing resin gaps even when the metallic radiator gaps are subjected to the expansion-and-contraction cycles and reducing the shift movement of the outer surface of the grease facing to the external air.

Regarding the heat receiving members of this invention, it is possible to use heat receiving members having insulating sheets attached on their surfaces. It is also possible to use metallic members with electric insulating layers formed on their surfaces, or electric insulating members. When the heat receiving members are brought into contact with the metallic radiator plates via insulating sheets, it is preferable to dispose the thermal conductive grease between the heat receiving members and the insulating sheets. Regarding the grease of this invention, it is possible to use grease having electric conductivity and/or electrical insulating properties. The thermal conductive grease used in this invention may contain powders, such as aluminum fillers, silver powders, copper powders, or any other metal oxides or metal nitrides having excellent thermal conductivity. It is also possible to use grease or ordinary metal joint, such as solder joint, to bond the semiconductor chip and the metallic radiator plates. Regarding the semiconductor chip of this invention, it is possible to use an ordinary semiconductor chip or a semiconductor module having CSP (chip size package) structure. Regarding the metallic radiator plates of this invention, it is possible to use metallic radiator plates capable of functioning as electrode terminals. The semiconductor module of this invention can accommodate a plurality of semiconductor chips. Each semiconductor chip can include a single transistor or an integrated circuit. The semiconductor module of this invention is, for example, a so-called ceramic package or a resin package which has a double-sided heat dissipating structure including metallic radiator plates on both sides to dissipate heat from their surfaces via grease. In the case of the ceramic package structure, its ceramic seal portion should be regarded as equivalent to the sealing resin of the present invention.

According to a preferred embodiment of the present invention, the grease reservoirs are formed along entire the periphery of the metallic radiator gaps. According to this arrangement, the metallic radiator gaps are completely surrounded along the entire periphery thereof by the sealing resin gaps having larger widths in the thickness direction. Thus, this arrangement brings the effect of adequately preventing invasion of external air.

According to a preferred embodiment of the present invention, the grease reservoirs are arranged by providing chamfered portions along peripheral corner portions of the sealing resin facing to the sealing resin gaps being filled with the grease, and clearances between the chamfered portions and the heat receiving members gradually increase with increasing distance from the metallic radiator gaps. According to this arrangement, the grease width of each sealing resin gap in the thickness direction of the semiconductor module continuously increases with increasing distance from the metallic radiator gaps. Thus, the shifting speed of the grease in the surface direction does not locally change suddenly in the sealing resin gap. This effectively prevents external air from entering into the inside of the grease gas through the interface between the grease and the sealing resin or the interface between the grease and the heat receiving member.

According to a preferred embodiment of the present invention, the grease reservoirs are arranged by providing tapered surfaces on the principal surfaces of the sealing resin at regions facing to the sealing resin gaps being filled with the grease, and clearances between the tapered surfaces and the heat receiving members gradually increase with increasing distance from the metallic radiator gaps. This arrangement enhances the above-described effect of preventing invasion of external air.

According to a preferred embodiment of the present invention, the grease reservoirs are arranged by providing grooves on the principal surfaces of the sealing resin at regions facing to the sealing resin gaps being filled with the grease and surrounding the metallic radiator gaps. The grease frequently shifts from the grooves (i.e. grease reservoirs) to the metallic radiator gaps or vice versa in accordance with the expansion-and-contraction cycles of the metallic radiator plates and the heat receiving members in the thickness direction. However, the grooves can store a great amount of grease compared with that of the metallic radiator gaps. Accordingly, it becomes possible to reduce the shifting distance of the grease in the surface direction in the grooves. As a result, this arrangement ensures the above-described effect of preventing invasion of external air.

Furthermore, according to this arrangement, the grooves can hold the grease adequately and accordingly brings the effects of preventing leakage of grease (i.e. preventing the grease from leaking out of the sealing resin gaps to the outside). Thus, it becomes possible to surely hold the grease regardless of repetition of the above-described expansion-and-contraction cycles.

According to a preferred embodiment of the present invention, the grooves are arranged by combining step surfaces provided on the sealing resin with step surfaces of the heat receiving members facing to the step surfaces of the sealing resin. This arrangement realizes a simple structure for storing a great amount of grease around the metallic radiator plates. Thus, this arrangement can enhance the effects of preventing invasion of external air and leakage of grease. In this case, the above-described step surfaces provided on the sealing resin can be replaced with the side surfaces of the metallic radiator plates.

According to a preferred embodiment of the present invention, the grooves are a plurality of grooves helically or coaxially disposed at regions spaced from the metallic radiator plates. The grooves are capable of storing a great amount of grease. Thus, this arrangement can enhance the above-described effects of preventing invasion of external air and leakage of grease.

According to a preferred embodiment of the present invention, the grease reservoirs are arranged by providing the heat dissipating surfaces of the metallic radiator plates so as to protrude toward the heat receiving members than the principal surfaces of the sealing resin. This arrangement makes it possible to store a great amount of grease around the metallic radiator plates without forming the grooves on the sealing resin or on the heat receiving members. Thus, this arrangement can enhance the above-described effect of preventing invasion of external air.

According to a preferred embodiment of the present invention, the grease reservoirs are arranged by forming the heat dissipating surfaces of the metallic radiator plates so as to protrude toward the heat receiving members than the principal surfaces of the sealing resin so that the grease reservoirs are 5 to 30 times the metallic radiator gaps. This arrangement ensures the effects of preventing invasion of external air and leakage of grease. More specifically, storing a great amount of grease around the metallic radiator gap brings the effect of reducing the shift distance of the grease in the surface direction against a change of the metallic radiator gap in the region surrounding this metallic radiator gap. However, this effect will deteriorate when the expansion amount of the sealing resin gap is less than 5 times the expansion amount of the metallic radiator gap. Furthermore, if the sealing resin gap is greater than 30 times the metallic radiator gap, the grease will have insufficient surface tension against the sealing resin or the heat receiving member and accordingly will easily flow in accordance with vibrations and may leak to the outside. Accordingly, setting the above-described range with respect to the relationship between the sealing resin gaps and the metallic radiator gaps enhances the effects of not only preventing leakage of grease but also preventing invasion of external air.

According to a preferred embodiment of the present invention, the grease reservoirs are arranged by forming step surfaces on the principal surfaces of the sealing resin, and distances between the principal surfaces of the sealing resin and the heat receiving members are increased in regions far from the metallic radiator plates compared with regions adjacent to the metallic radiator plates. This arrangement can enhance the above-described effect of preventing invasion of external air.

According to a preferred embodiment of the present invention, the grease reservoirs are arranged by providing chamfered portions along peripheral corner portions of the heat receiving member or the insulating sheet facing to the sealing resin gaps being filled with the grease, and clearances between the chamfered portions and the sealing resin gradually increase with increasing distance from the metallic radiator gaps. This arrangement can enhance the above-described effects of preventing invasion of external air and leakage of grease.

According to a preferred embodiment of the present invention, the grease reservoirs are arranged by providing tapered surfaces on the principal surfaces of the heat receiving member or the insulating sheet at regions facing to the sealing resin gaps being filled with the grease, and clearances between the tapered surfaces and the sealing resin gradually increase with increasing distance from the metallic radiator gaps. This arrangement can enhance the above-described effect of preventing invasion of external air.

According to a preferred embodiment of the present invention, the grease reservoirs are arranged by providing grooves on the principal surfaces of the heat receiving members at regions facing to the sealing resin gaps being filled with the grease and surrounding the metallic radiator gaps. This arrangement can enhance the above-described effect of preventing invasion of external air.

According to a preferred embodiment of the present invention, the grooves are a plurality of grooves helically or coaxially disposed at regions spaced from the metallic radiator plates. This arrangement can enhance the above-described effects of preventing invasion of external air and leakage of grease.

According to a preferred embodiment of the present invention, the grease reservoirs are arranged by forming step surfaces on the principal surfaces of the heat receiving members, and distances between the principal surfaces of the sealing resin and the heat receiving members are increased in regions far from the metallic radiator plates compared with regions adjacent to the metallic radiator plates.

According to a preferred embodiment of the present invention, the metallic radiator plates have long grooves formed on the heat dissipating surfaces so as to extend from their central regions to peripheral regions, and the long grooves are filled with the grease. According to this arrangement, the long grooves allow expansions and contractions of the grease in the surface direction in the central regions of the metallic radiator gaps between the metallic radiator plates of the semiconductor module and the heat receiving members facing to these metallic radiator plates. Thus, it becomes possible to suppress the flow and movement of the grease in the surface direction in the ordinary gap between the metallic radiator plate and the heat receiving member. It becomes possible to suppress invasion of external air into this region, and accordingly the thermal conductivity between the metallic radiator plates and the heat receiving members can be adequately maintained. Furthermore, the long grooves can serve as grease extrusion passages when excessive grease is pushed out of the grease gap in the process of bonding the metallic radiator plates and the heat receiving members. Thus, it becomes possible to apply adequate amount of grease without leaving excessive grease in the central region of the metallic radiator plate and also promptly extrude the excessive grease to the outside without applying a large pressure for a long time. The workability of the grease bonding work can be improved.

Furthermore, the inventors provide a cardlike semiconductor module including a semiconductor chip, a sealing resin accommodating the semiconductor chip and having two principal surfaces substantially parallel to each other, and metallic radiator plates having flat heat dissipating surfaces exposed from the principal surfaces of the sealing resin and fixed on central regions of the principal surfaces of the sealing resin. The principal surfaces of the sealing resin define grease reservoirs surrounding the metallic radiator plates. And, the grease reservoirs are arranged by reducing the thickness of the sealing resin at principal surfaces corresponding to the grease reservoirs compared with the thickness of the sealing resin at principal surfaces corresponding to the metallic radiator plates.

Namely, the cardlike semiconductor module of this invention is a semiconductor module used in the above-described semiconductor module mounting structure. The cardlike semiconductor module of this invention has the structure capable of adequately holding a great amount of grease at regions surrounding metallic radiator plates, i.e. so that the applied grease can be chiefly stored at the regions adjacent to the principal surfaces of the sealing resin rather than the principal surfaces of the metallic radiator plates, i.e. heat dissipating surfaces. This arrangement ensures the above-described effect of preventing invasion of external air when it is employed in the above-described semiconductor module mounting structure. Namely, using this cardlike semiconductor module of this invention can surely prevent external air from entering into clearances between internal heat transfer surfaces.

According to a preferred embodiment of the present invention, the grease reservoirs are arranged by forming grooves on the principal surfaces of the sealing resin. This arrangement enhances the above-described effects of preventing invasion of external air and leakage of grease.

According to a preferred embodiment of the present invention, the grooves are a plurality of grooves helically or coaxially disposed at regions spaced from the metallic radiator plates. This arrangement enhances the above-described effects of preventing invasion of external air and leakage of grease.

According to a preferred embodiment of the present invention, the grease reservoirs are arranged by forming step surfaces on the principal surfaces of the sealing resin, and the thickness of the sealing resin is reduced at regions far from the metallic radiator plates compared with regions adjacent to the metallic radiator plates. This arrangement enhances the above-described effects of preventing invasion of external air.

According to a preferred embodiment of the present invention, the metallic radiator plates have long grooves formed on the heat dissipating surfaces so as to extend from their central regions to peripheral regions, and the long grooves are filled with the grease. This arrangement enhances the above-described effect of preventing invasion of external air.

Furthermore, the inventors provide a pair of heat receiving members bonded to a cardlike semiconductor module including a semiconductor chip, a sealing resin accommodating the semiconductor chip and having two principal surfaces substantially parallel to each other, and metallic radiator plates having flat heat dissipating surfaces exposed from the principal surfaces of the sealing resin and fixed on central regions of the principal surfaces of the sealing resin. The heat receiving members of this invention have heat receiving surfaces facing to the principal surfaces of the sealing resin and to the heat dissipating surfaces of the metallic radiator plates. And, thicknesses of the heat receiving members are reduced at regions surrounding the metallic radiator plates compared with regions adjacent to the metallic radiator plates so as to form grease reservoirs at the regions surrounding the metallic radiator plates. This arrangement enhances the above-described effect of preventing invasion of external air. In short, using the heat receiving members of this invention can surely prevent external air from entering into clearances between internal heat transfer surfaces.

According to a preferred embodiment of the present invention, the grease reservoirs are arranged by forming grooves on the principal surfaces of the sealing resin. This arrangement enhances the above-described effects of preventing invasion of external air and leakage of grease.

According to a preferred embodiment of the present invention, the grooves are a plurality of grooves helically or coaxially disposed at regions spaced from the metallic radiator plates. This arrangement enhances the above-described effects of preventing invasion of external air and leakage of grease.

According to a preferred embodiment of the present invention, the grease reservoirs are arranged by forming step surfaces on the principal surfaces of the heat receiving members, and thicknesses of the heat receiving members are reduced at regions far from the metallic radiator plates compared with regions adjacent to the metallic radiator plates. This arrangement enhances the above-described effect of preventing invasion of external air.

Hereinafter, practical embodiments of the semiconductor module mounting structure in accordance with the present invention will be explained with reference to the attached drawings. However, the present invention is not limited to the following embodiments and can be embodied in various ways.

First Embodiment

Figure 1:
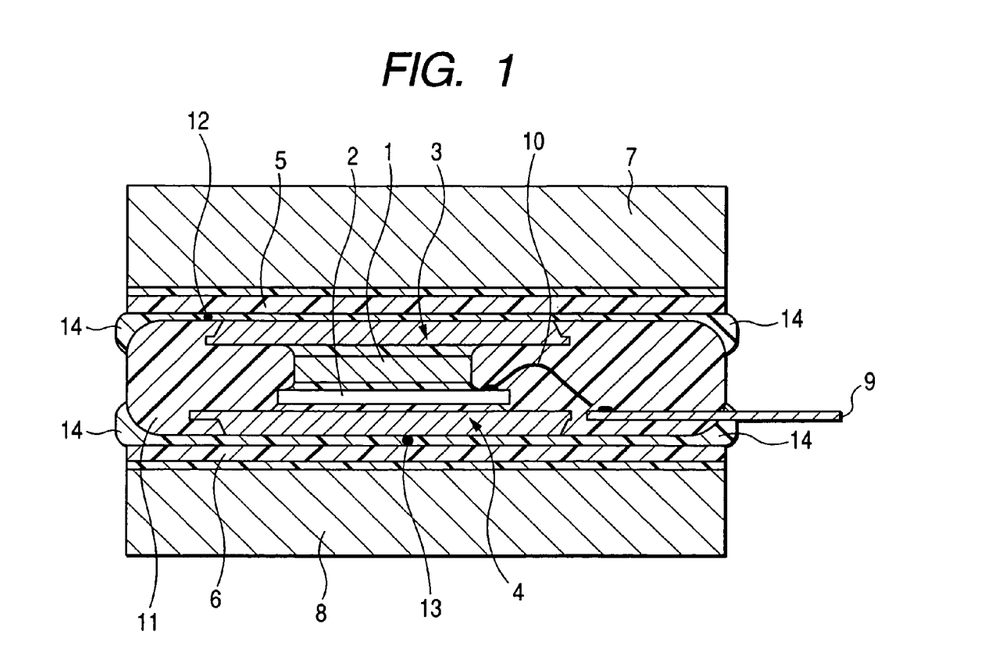
FIG. 1 is a cross-sectional side view showing a semiconductor module mounting structure in accordance with a first embodiment of the present invention.

A semiconductor module mounting structure in accordance with a first embodiment of the present invention will be explained with reference to FIG. 1. FIG. 1 is a cross-sectional side view showing a semiconductor module mounting structure in accordance with the first embodiment of the present invention.

A semiconductor module used in this semiconductor module mounting structure is a thin-plate cardlike semiconductor module (hereinafter, referred to as a semiconductor module) which accommodates a semiconductor chip 2. The semiconductor chip 2 has an upper principal surface on which a first principal electrode (not shown) is formed. The first principal electrode is bonded, for example by solder joint, to a metallic member 1 having excellent electric conductivity. The metallic member 1 has a front end portion (not shown) extending to the outside so as to form a first principal electrode terminal. Furthermore, the metallic member 1 has an upper surface bonded, for example by solder joint, to a first metallic radiator plate 3 acting as a heat sink. The semiconductor chip 2 has a lower principal surface which is electrically connected, for example by solder joint, to a second metallic radiator plate 4. The second metallic radiator plate 4 a front end portion (not shown) extending to the outside so as to form a second principal electrode terminal. It is however possible to omit the metallic member 1 in a case that the first metallic radiator plate 3 is modified to have an externally extending portion forming a first principal electrode terminal.

Two, i.e. first and second, insulating sheets 5 and 6 are provided to contact with the first and second metallic radiator plates 3 and 4, respectively. The first metallic radiator plate 3 is bonded to the heat receiving member 7 via the first insulating sheet 5. The second metallic radiator plate 4 is bonded to the heat receiving member 8 via the second insulating sheet 6. In the drawings, the first insulating sheet 5 is enlargedly shown to have a large thickness. However, it is preferable that the practical thickness of the first insulating sheet 5 is reduced to improve heat radiation properties. Furthermore, these insulating sheets 5 and 6 can be omitted when no electrical insulation is required between the metallic radiator plates 3 and 4 and the heat receiving members 7 and 8.

An electrode terminal 9 is a control electrode terminal for the semiconductor chip 2 on which a power semiconductor switching element is formed. The control electrode terminal 9 is connected via a bonding wire 10 to a control electrode terminal region formed on the upper surface of the semiconductor chip 2.

A sealing resin 11 seals the semiconductor chip 2 and fixes the metallic radiator plates 3 and 4. The first metallic radiator plate 3 has a flat outer principal surface bonded to the first insulating sheet 5 via a first grease layer 12. The first grease layer 12 extends into a clearance between the first insulating sheet 5 and the principal surface of the sealing resin 11. Similarly, the second metallic radiator plate 4 has a flat outer principal surface bonded to the second insulating sheet 6 via a second grease layer 13. The second grease layer 13 extends into a clearance between the second insulating sheet 6 and the principal surface of the sealing resin 11. In short, the first and second grease layers 12 and 13 are filled in metallic radiator gaps and also in sealing resin gaps of the present invention. The metallic radiator gaps of the present invention are provided between the insulating sheets 5 and 6 and outer principal surfaces (i.e. heat dissipating surfaces of the present invention) of the metallic radiator plates 3 and 4. The sealing resin gaps of the present invention are provided between the insulating sheets 5 and 6 and the principal surfaces of the sealing resin 11. Accordingly, the insulating sheets 5 and 6 and the heat receiving members 7 and 8 cooperatively arrange the heat receiving members of the present invention.

The metallic radiator plates 3 and 4 have flat outer principal surfaces (i.e. heat dissipating surfaces) which are formed to be parallel to each other. The heat dissipating surfaces of the metallic radiator plates 3 and 4 are bonded to inner surfaces of the heat receiving members 7 and 8 via the grease layers 12 and 13 and the insulating sheets 5 and 6. In this respect, the inner surfaces of respective heat receiving members 7 and 8 are arranged as heat receiving surfaces for receiving heat from the heat dissipating surfaces of the metallic radiator plates 3 and 4. The insulating sheets 5 and 6 and the heat receiving members 7 and 8 are bonded with thermal conductive grease. According to this embodiment, the above-described heat dissipating surfaces of the metallic radiator plates 3 and 4 slightly protrude than the principal surfaces of the sealing resin 11.

The heat receiving members 7 and 8 of this embodiment are made of metallic members having excellent thermal conductivity, or any other members having excellent thermal conductivity. The heat receiving members 7 and 8 are held in a housing (not shown) so that a semiconductor module accommodating space having a substantially constant width is provided between these heat receiving members 7 and 8.

This embodiment has the following characteristics. The peripheral corner portions of the sealing resin 11 facing to the sealing resin gaps being filled with grease (i.e. grease filling gaps neighboring to the sealing resin 11) are chamfered to have a roundness (e.g. equal to or larger than R 0.1) so as to gradually widen the grease filling gaps with increasing distance from the metallic radiator gaps (i.e. the grease filling gaps neighboring the metallic radiator plates 3 and 4). According to this arrangement, the grease filling gaps facing to the chamfered peripheral corner portions of the sealing resin 11 are locally enlarged in the thickness direction compared with other portions, so as to form grease reservoirs 14 of the present invention.

According to the arrangement of this embodiment, thicknesses of applied grease (i.e. the size of the sealing resin gaps in the thickness direction of the semiconductor module) in the regions facing to the peripheral corner portions of the sealing resin 11 continuously increase with increasing distance from the metallic radiator gaps. With this arrangement, the grease filling gaps facing to the chamfered peripheral corner portions of the sealing resin 11 are widened in the thickness direction so as to store a great amount of grease compared with the metallic radiator gaps. Namely, the grease filling gaps facing to the chamfered peripheral corner portions of the sealing resin 11 form the grease reservoirs of the present invention.

As a result, it becomes possible to reduce the shift amount (in the surface direction) of the grease stored in the grease reservoirs 14 facing to the above-described peripheral corner portions of the sealing resin 11 even when the grease stored in the grease reservoirs 14 shifts to compensate changes of the metallic radiator gaps between the metallic radiator plates 3 and 4 and the insulating sheets 5 and 6. As described above, such changes of the metallic radiator gaps occur due to the above-described heating and cooling operations of the semiconductor chip 2 which cause the metallic radiator plates 3 and 4 to expand and contract and accordingly induce a so-called grease breathing phenomenon according to which the grease is sucked into the metallic radiator gaps and pushed out to the outside. Accordingly, the arrangement of this embodiment brings the effect of adequately preventing external air from entering into the metallic radiator gaps in accordance with the grease shifting in the grease reservoirs 14. According to the embodiment, it is preferable to form the above-described chamfered peripheral corner portions along the entire periphery of the sealing resin 11 to provide the grease reservoirs 14.

Second Embodiment

Figure 2:
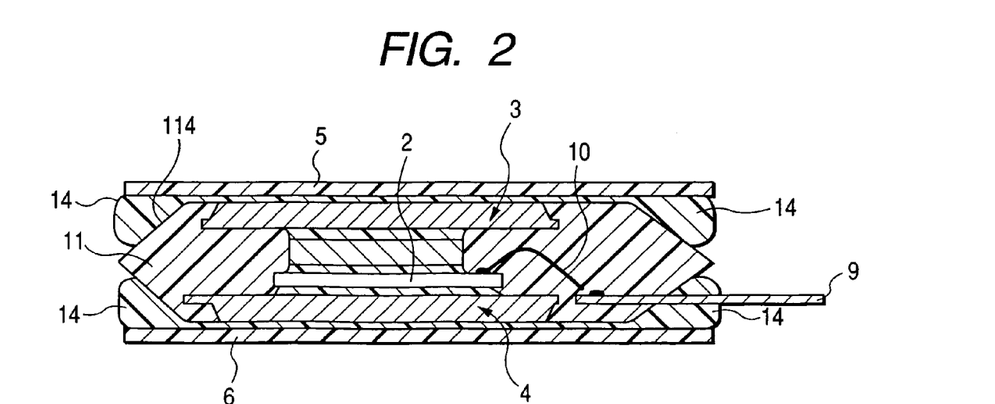
FIG. 2 is a cross-sectional side view showing a semiconductor module mounting structure in accordance with a second embodiment of the present invention.

A semiconductor module mounting structure in accordance with a second embodiment of the present invention will be explained hereinafter with reference to FIG. 2. This embodiment is characterized in that tapered surfaces 114 are provided on the principal surfaces of the sealing resin 11 instead of forming the round chamfered portions at the peripheral corner portions of the sealing resin 11 as disclosed in the first embodiment. The tapered surfaces 114, i.e. inclined flat surfaces, define the grease reservoirs 14 surrounding the metallic radiator plates 3 and 4. This embodiment brings the effects substantially similar to those brought by the first embodiment.

Third Embodiment

Figure 3:
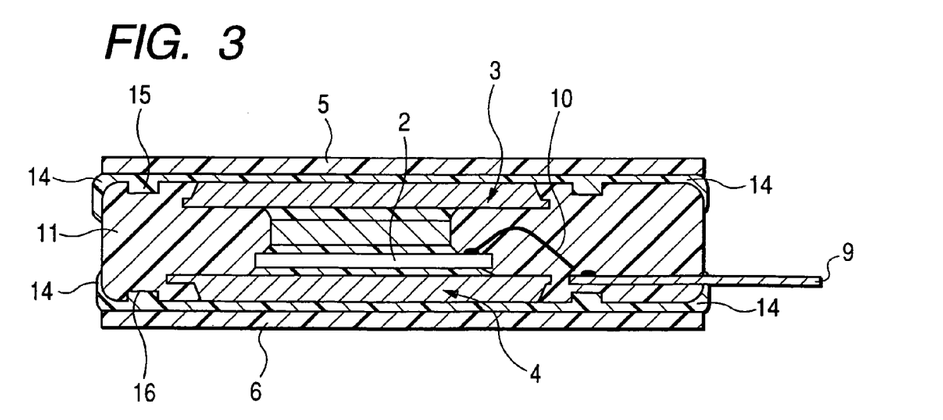
FIG. 3 is a cross-sectional side view showing a semiconductor module mounting structure in accordance with a third embodiment of the present invention.

A semiconductor module mounting structure in accordance with a third embodiment of the present invention will be explained hereinafter with reference to FIG. 3. This embodiment is characterized in that grooves 15 and 16 are provided on the principal surfaces of the sealing resin 11 along the periphery of the sealing resin 11 so as to surround the metallic radiator plates 3 and 4. This embodiment brings the effects substantially similar to those brought by the first embodiment. To ensure the effects of the present invention, it is preferable to provide the grooves 15 and 16 so as to extend entirely along the periphery of the metallic radiator plates 3 and 4.

Fourth Embodiment

Figure 4:
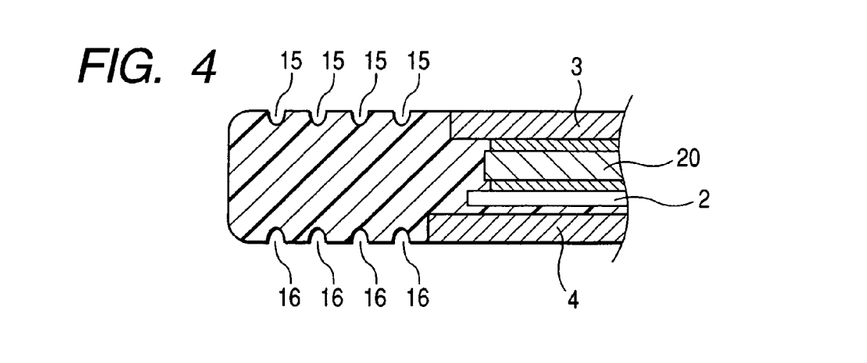
FIG. 4 is a cross-sectional side view showing a semiconductor module mounting structure in accordance with a fourth embodiment of the present invention.

A semiconductor module mounting structure in accordance with a fourth embodiment of the present invention will be explained hereinafter with reference to FIG. 4. Although FIG. 4 shows only a part of the semiconductor module, this embodiment provides a semiconductor module mounting structure when the insulating sheets 5 and 6 and the heat receiving members 7 and 8 are assembled as disclosed in the first embodiment shown in FIG. 1. This embodiment is characterized in that a total of four grooves 15 and 16 are serially or successively provided on respective principal surfaces of the sealing resin 11. Each of the grooves 15 and 16 has substantially the same or similar arrangement as the grooves 15 and 16 disclosed in the third embodiment. The arrangement of this embodiment enhances the above-described effects of the grease reservoirs arranged by the grooves 15 and 16. The four grooves 15 and 16, serially or successively disposed on respective principal surfaces of the sealing resin 11, can be arranged helically or annularly.

Fifth Embodiment

Figure 5:
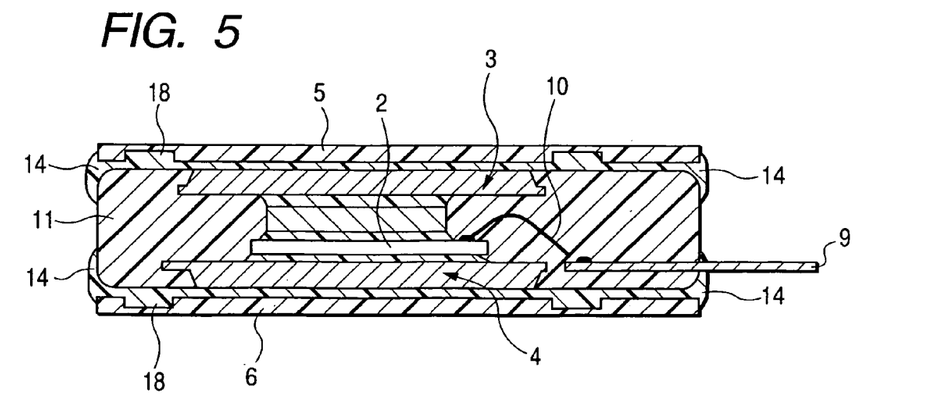
FIG. 5 is a cross-sectional side view showing a semiconductor module mounting structure in accordance with a fifth embodiment of the present invention.

A semiconductor module mounting structure in accordance with a fifth embodiment of the present invention will be explained hereinafter with reference to FIG. 5. This embodiment is characterized in that grooves 18 are provided on the inner surfaces of the insulating sheets 5 and 6 so as to surround the metallic radiator plates 3 and 4. This embodiment brings the effects substantially similar to those brought by the third embodiment. It will be, however, possible to form the grooves on the heat receiving members 7 and 8 if the insulating sheets 5 and 6 are not provided in the above regions. Furthermore, it is preferable to form serially or successively disposed grooves 18, like the arrangement shown in the fourth embodiment.

Sixth Embodiment

Figure 6:
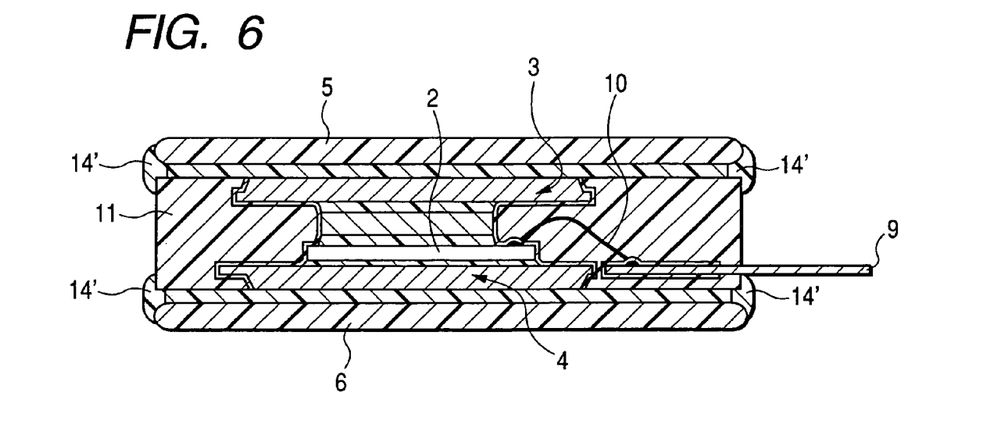
FIG. 6 is a cross-sectional side view showing a semiconductor module mounting structure in accordance with a sixth embodiment of the present invention.

A semiconductor module mounting structure in accordance with a sixth embodiment of the present invention will be explained hereinafter with reference to FIG. 6. This embodiment is characterized in that, instead of roundly chamfering the peripheral corner portions of the sealing resin 11, the peripheral corner portions of the insulating sheets 5 and 6 are roundly chamfered to arrange the grease reservoirs 14. This embodiment brings the effects substantially similar to those brought by the first embodiment. It will be, however, possible to roundly chamfer the peripheral corner portions of the heat receiving members 7 and 8 if the insulating sheets 5 and 6 are not provided in the above regions.

Seventh Embodiment

Figure 7:
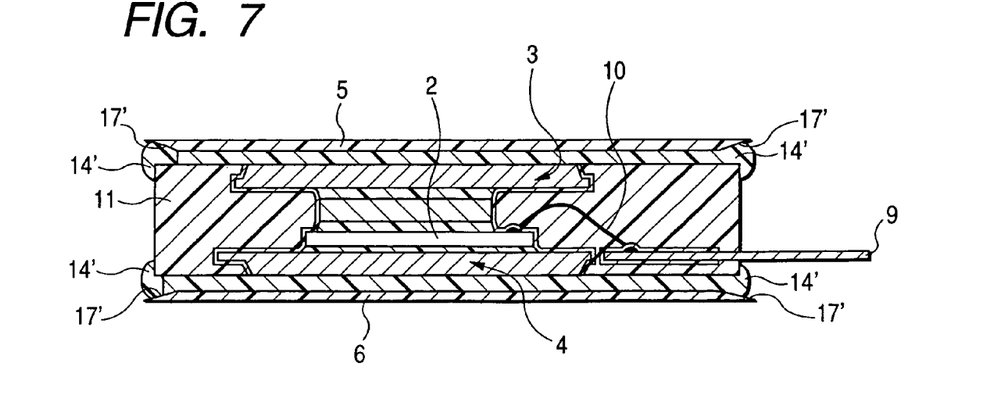
FIG. 7 is a cross-sectional side view showing a semiconductor module mounting structure in accordance with a seventh embodiment of the present invention.

A semiconductor module mounting structure in accordance with a seventh embodiment of the present invention will be explained hereinafter with reference to FIG. 7. This embodiment is characterized in that, instead of roundly chamfering the peripheral corner portions of the insulating sheets 5 and 6 as explained in the sixth embodiment, tapered surfaces 17' are provided on respective inner surfaces of the insulating sheets 5 and 6 to arrange the grease reservoirs along their peripheral corner portions. This embodiment brings the effects substantially similar to those brought by the second embodiment.

Eighth Embodiment

Figure 8:
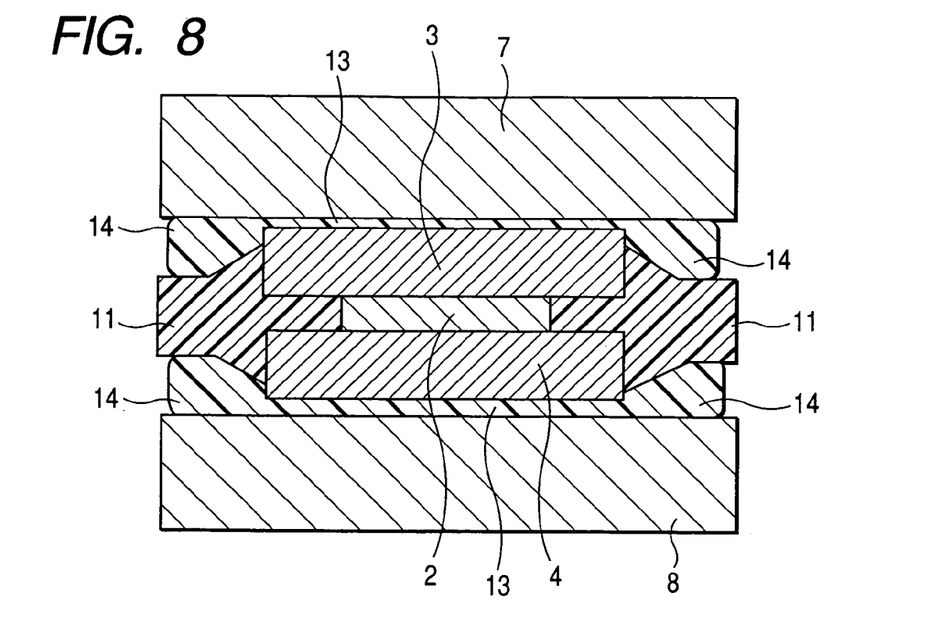
FIG. 8 is a cross-sectional side view showing a semiconductor module mounting structure in accordance with an eighth embodiment of the present invention.

A semiconductor module mounting structure in accordance with an eighth embodiment of the present invention will be explained hereinafter with reference to FIG. 8. This embodiment is characterized in that, instead of providing the tapered surfaces along the entire periphery of the sealing resin 11 as disclosed in the second embodiment, tapered surfaces are provided on the principal surfaces of the sealing resin 11 locally in the vicinity of the metallic radiator plates 3 and 4 so as to surround the metallic radiator plates 3 and 4. This arrangement brings the effects substantially similar to those of the second embodiment. According to this embodiment, the insulating sheets 5 and 6 and the metallic member 1 disclosed in the second embodiment are omitted.

Ninth Embodiment

Figure 9:
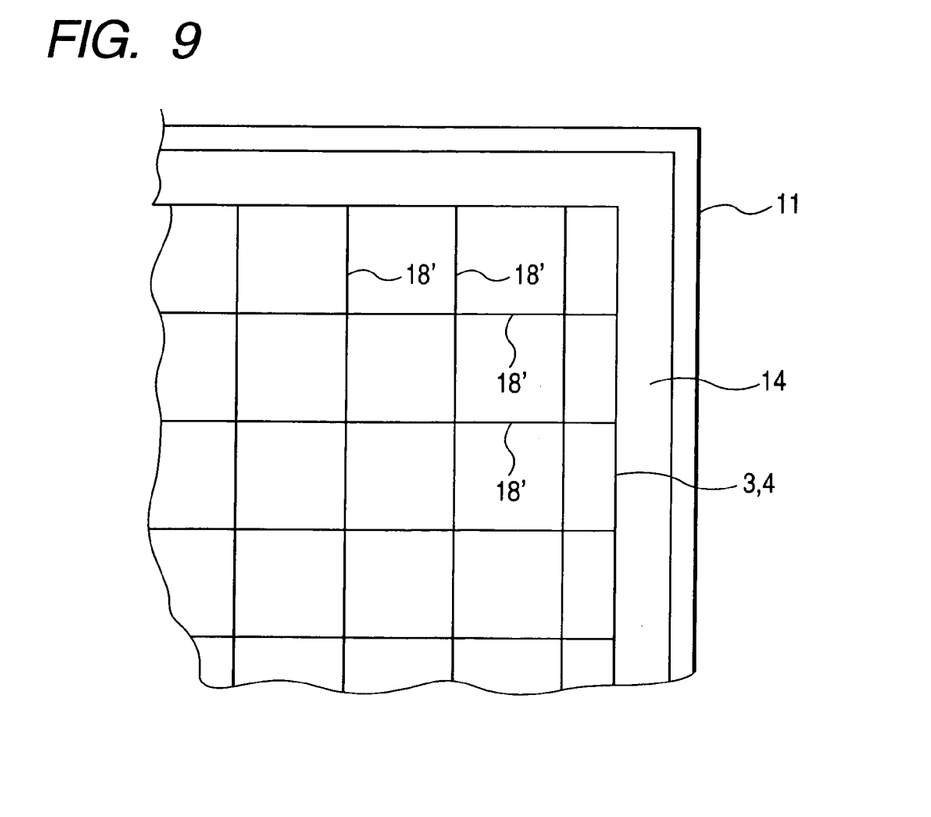
FIG. 9 is a cross-sectional side view showing a semiconductor module mounting structure in accordance with a ninth embodiment of the present invention.

A semiconductor module mounting structure in accordance with a ninth embodiment of the present invention will be explained hereinafter with reference to FIG. 9. This embodiment is characterized in that the metallic radiator plates 3 and 4 have long grooves 18', each having a narrow width, formed on their heat dissipating surfaces. This arrangement is applicable to the semiconductor module mounting structure disclosed in any one of the above-described embodiments. More specifically, the long grooves 18' consisting of a matrix pattern are arranged on the flat surfaces of the metallic radiator plates 3 and 4 facing to the grease gaps. Respective long grooves 18' extend from the central regions of the metallic radiator plates 3 and 4 to the peripheral regions in the surface direction. This arrangement makes it possible to provide smaller metallic radiator gaps between the metallic radiator plates 3 and 4 and the insulating sheets 5 and 6, or between the metallic radiator plates 3 and 4 and the heat receiving members 7 and 8. These long grooves 18' facilitate shift movement of the external grease entering into the metallic radiator gaps or the grease discharging from the metallic radiator gaps to the outside.

Tenth Embodiment

Figure 10:
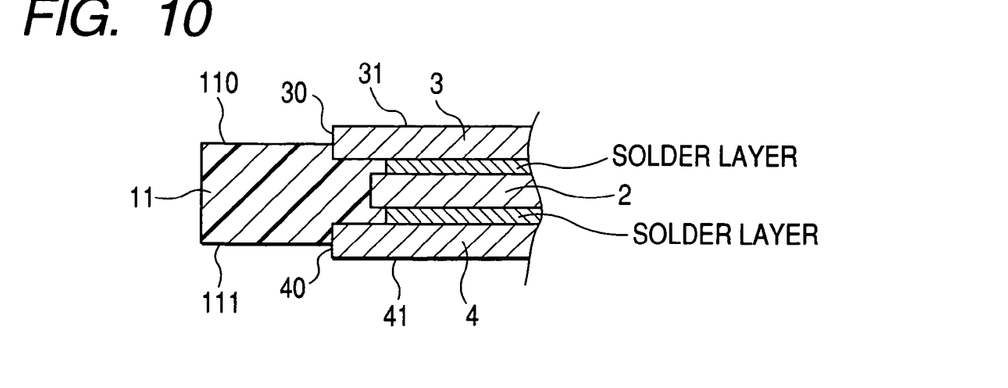
FIG. 10 is a cross-sectional side view showing a semiconductor module mounting structure in accordance with a tenth embodiment of the present invention.

A semiconductor module mounting structure in accordance with a tenth embodiment of the present invention will be explained hereinafter with reference to FIG. 10. Although FIG. 10 shows only a part of the semiconductor module, this embodiment provides a semiconductor module mounting structure when the insulating sheets 5 and 6 and the heat receiving members 7 and 8 are assembled as disclosed in the first embodiment shown in FIG. 1. According to this embodiment, the thickness of the sealing resin 11 (i.e. the distance between two principal surfaces 110 and 111) is set to be smaller than the distance between the principal surface (i.e. heat dissipating surface) 31 of the first metallic radiator plate 3 and the principal surface (i.e. heat dissipating surface) 41 of the second metallic radiator plate 4. The first metallic radiator plate 3 has an exposed side surface 30, and the second metallic radiator plate 4 has an exposed side surface 40. According to the arrangement of this embodiment, grease reservoirs facing to the principal surfaces 110 and 111 of the sealing resin 11 are provided when other members are assembled to arrange the semiconductor module mounting structure shown in FIG. 1. Thus, this embodiment provides the arrangement for simply forming the grease reservoirs.

Eleventh Embodiment

Figure 11:
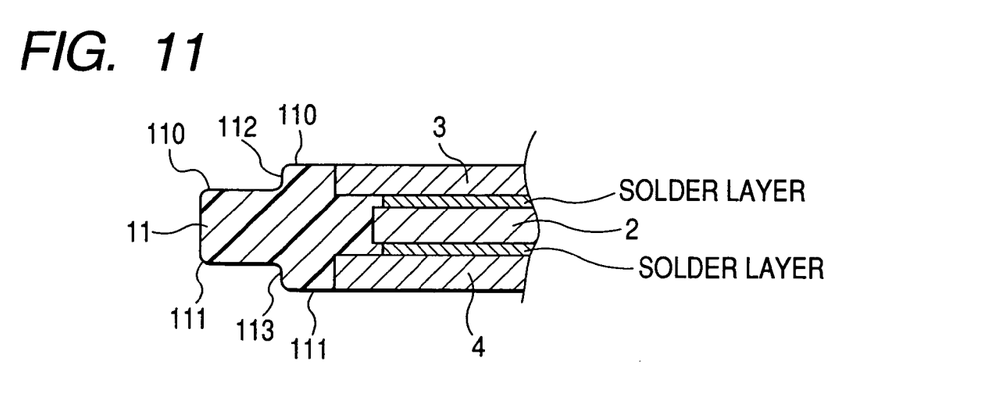
FIG. 11 is a cross-sectional side view showing a semiconductor module mounting structure in accordance with an eleventh embodiment of the present invention.

A semiconductor module mounting structure in accordance with an eleventh embodiment of the present invention will be explained hereinafter with reference to FIG. 11. Although FIG. 11 shows only a part of the semiconductor module, this embodiment provides a semiconductor module mounting structure when the insulating sheets 5 and 6 and the heat receiving members 7 and 8 are assembled as disclosed in the first embodiment shown in FIG. 1. This embodiment is characterized in that step surfaces 112 and 113 are provided on two principal surfaces 110 and 111 of the sealing resin 11. This arrangement enhances the above-described effects of preventing invasion of external air.

Twelfth Embodiment

Figure 12:
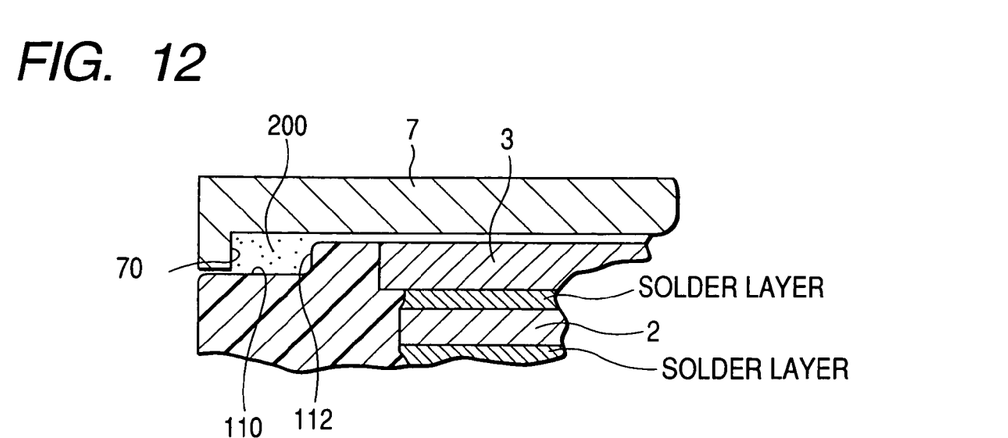
FIG. 12 is a cross-sectional side view showing a semiconductor module mounting structure in accordance with a twelfth embodiment of the present invention.

A semiconductor module mounting structure in accordance with a twelfth embodiment of the present invention will be explained hereinafter with reference to FIG. 12. Although FIG. 12 shows only a part of the semiconductor module, this embodiment provides a semiconductor module mounting structure when the insulating sheets 5 and 6 and the heat receiving members 7 and 8 are assembled as disclosed in the first embodiment shown in FIG. 1. This embodiment is characterized in that not only the step surfaces 112 are provided on the principal surfaces 110 and 111 of the sealing resin 11 but also step surfaces 70 are provided on the inner surfaces of the heat receiving members 7 and 8. The step surfaces 112 and the step surfaces 70 are opposed to each other to arrange grease reservoirs 200 between them. This arrangement can provide the grease reservoirs capable of storing a great amount of grease and accordingly enhances the effect of preventing the leakage of grease.

Modified Embodiments

Although not shown in the drawings, it will be readily understood that the above-described various structures for arranging the grease reservoirs on the semiconductor module can be equally applied in mirror symmetry to the heat receiving members 7 and 8.

What is claimed is:

1. A semiconductor module mounting structure comprising a cardlike semiconductor module, heat receiving members, metallic radiator gaps, and sealing resin gaps, wherein
said cardlike semiconductor module comprises a semiconductor chip, a sealing resin accommodating said semiconductor chip and having two principal surfaces substantially parallel to each other, and metallic radiator plates having flat heat dissipating surfaces exposed from the principal surfaces of said sealing resin and fixed on central regions of said principal surfaces of said sealing resin;
said heat receiving members have heat receiving surfaces bonded to said heat dissipating surfaces of said metallic radiator plates directly or via insulating sheets having electrical insulating properties, to absorb heat from said heat dissipating surfaces of said metallic radiator plates;
said metallic radiator gaps are filled with thermal conductive grease and are positioned between said heat dissipating surfaces of said metallic radiator plates and said heat receiving members or said insulating sheets; and
said sealing resin gaps are filled with thermal conductive grease and are positioned between said principal surfaces of said sealing resin and said heat receiving members or said insulating sheets at regions surrounding said metallic radiator plates, wherein
said sealing resin gaps have grease reservoirs as enlarged portions larger than said metallic radiator gaps.

2. The semiconductor module mounting structure in accordance with claim 1, wherein said grease reservoirs are formed along the entire periphery of said metallic radiator gaps.

3. The semiconductor module mounting structure in accordance with claim 1, wherein said grease reservoirs are arranged by providing chamfered portions along peripheral corner portions of said sealing resin facing to said sealing resin gaps being filled with said grease, and clearances between said chamfered portions and said heat receiving members gradually increase with increasing distance from said metallic radiator gaps.

4. The semiconductor module mounting structure in accordance with claim 1, wherein said grease reservoirs are arranged by providing tapered surfaces on said principal surfaces of said sealing resin at regions facing to said sealing resin gaps being filled with said grease, and clearances between said tapered surfaces and said heat receiving members gradually increase with increasing distance from said metallic radiator gaps.

5. The semiconductor module mounting structure in accordance with claim 1, wherein said grease reservoirs are arranged by providing grooves on said principal surfaces of said sealing resin at regions facing to said sealing resin gaps being filled with said grease and surrounding said metallic radiator gaps.

6. The semiconductor module mounting structure in accordance with claim 5, wherein said grooves are arranged by combining step surfaces provided on said sealing resin with step surfaces of said heat receiving members facing to said step surfaces of said sealing resin.

7. The semiconductor module mounting structure in accordance with claim 5, wherein said grooves are a plurality of grooves helically or coaxially disposed at regions spaced from said metallic radiator plates.

8. The semiconductor module mounting structure in accordance with claim 1, wherein said grease reservoirs are arranged by providing said heat dissipating surfaces of said metallic radiator plates so as to protrude toward said heat receiving members than said principal surfaces of said sealing resin.

9. The semiconductor module mounting structure in accordance with claim 8, wherein said grease reservoirs are arranged by forming said heat dissipating surfaces of said metallic radiator plates so as to protrude toward said heat receiving members than said principal surfaces of said sealing resin so that said grease reservoirs are 5 to 30 times the metallic radiator gaps.

10. The semiconductor module mounting structure in accordance with claim 1, wherein said grease reservoirs are arranged by forming step surfaces on the principal surfaces of said sealing resin, and distances between the principal surfaces of said sealing resin and said heat receiving members are increased in regions far from the metallic radiator plates compared with regions adjacent to said metallic radiator plates.

11. The semiconductor module mounting structure in accordance with claim 1, wherein said grease reservoirs are arranged by providing chamfered portions along peripheral corner portions of said heat receiving member or said insulating sheet facing to said sealing resin gaps being filled with said grease, and clearances between said chamfered portions and said sealing resin gradually increase with increasing distance from said metallic radiator gaps.

12. The semiconductor module mounting structure in accordance with claim 1, wherein said grease reservoirs are arranged by providing tapered surfaces on said principal surfaces of said heat receiving member or said insulating sheet at regions facing to said sealing resin gaps being filled with said grease, and clearances between said tapered surfaces and said sealing resin gradually increase with increasing distance from said metallic radiator gaps.

13. The semiconductor module mounting structure in accordance with claim 2, wherein said grease reservoirs are arranged by providing grooves on said principal surfaces of said heat receiving members at regions facing to said sealing resin gaps being filled with said grease and surrounding said metallic radiator gaps.

14. The semiconductor module mounting structure in accordance with claim 13, wherein said grooves are a plurality of grooves helically or coaxially disposed at regions spaced from said metallic radiator plates.

15. The semiconductor module mounting structure in accordance with claim 1, wherein said grease reservoirs are arranged by forming step surfaces on the principal surfaces of said heat receiving members, and distances between the principal surfaces of said sealing resin and said heat receiving members are increased in regions far from the metallic radiator plates compared with regions adjacent to said metallic radiator plates.

16. The semiconductor module mounting structure in accordance with claim 1, wherein said metallic radiator plates have long grooves formed on said heat dissipating surfaces so as to extend from their central regions to peripheral regions, and said long grooves are filled with said grease.

17. A cardlike semiconductor module comprising:
a semiconductor chip, a sealing resin accommodating said semiconductor chip and having two principal surfaces substantially parallel to each other, and metallic radiator plates having flat heat dissipating surfaces exposed from the principal surfaces of said sealing resin and fixed on central regions of said principal surfaces of said sealing resin, wherein
said principal surfaces of said sealing resin define grease reservoirs surrounding said metallic radiator plates, and
said grease reservoirs are arranged by reducing the thickness of said sealing resin at principal surfaces corresponding to said grease reservoirs compared with the thickness of said sealing resin at principal surfaces corresponding to said metallic radiator plates.

18. The cardlike semiconductor module in accordance with claim 17, wherein said grease reservoirs are arranged by forming grooves on the principal surfaces of said sealing resin.

19. The cardlike semiconductor module in accordance with claim 18, wherein said grooves are a plurality of grooves helically or coaxially disposed at regions spaced from said metallic radiator plates.

20. The cardlike semiconductor module in accordance with claim 17, wherein said grease reservoirs are arranged by forming step surfaces on the principal surfaces of said sealing resin, and the thickness of said sealing resin is reduced at regions far from said metallic radiator plates compared with regions adjacent to said metallic radiator plates.

21. The cardlike semiconductor module in accordance with claim 17, wherein said metallic radiator plates have long grooves formed on said heat dissipating surfaces so as to extend from their central regions to peripheral regions, and said long grooves are filled with said grease.

22. A pair of heat receiving members bonded to a cardlike semiconductor module comprising a semiconductor chip, a sealing resin accommodating said semiconductor chip and having two principal surfaces substantially parallel to each other, and metallic radiator plates having flat heat dissipating surfaces exposed from the principal surfaces of said sealing resin and fixed on central regions of said principal surfaces of said sealing resin, wherein
said heat receiving members have heat receiving surfaces facing to the principal surfaces of said sealing resin and to said heat dissipating surfaces of said metallic radiator plates, and
thicknesses of said heat receiving members are reduced at regions surrounding said metallic radiator plates compared with regions adjacent to said metallic radiator plates so as to form grease reservoirs at the regions surrounding said metallic radiator plates.

23. The heat receiving members bonded to a cardlike semiconductor module in accordance with claim 22, wherein said grease reservoirs are arranged by forming grooves on the principal surfaces of said sealing resin.

24. The heat receiving members bonded to a cardlike semiconductor module in accordance with claim 22, wherein said grooves are a plurality of grooves helically or coaxially disposed at regions spaced from said metallic radiator plates.

25. The heat receiving members bonded to a cardlike semiconductor module in accordance with claim 22, wherein said grease reservoirs are arranged by forming step surfaces on the principal surfaces of said heat receiving members, and thicknesses of said heat receiving members are reduced at regions far from said metallic radiator plates compared with regions adjacent to said metallic radiator plates.

* * * * *